United States Patent
Mizutani et al.

(10) Patent No.: US 11,208,616 B2
(45) Date of Patent: Dec. 28, 2021

(54) STRIPPING COMPOSITIONS FOR REMOVING PHOTORESISTS FROM SEMICONDUCTOR SUBSTRATES

(71) Applicant: Fujifilm Electronic Materials U.S.A., Inc., N. Kingstown, RI (US)

(72) Inventors: Atsushi Mizutani, Shizuoka (JP); William A. Wojtczak, Mesa, AZ (US); Yasuo Sugishima, Gilbert, AZ (US); Raj Sakamuri, Sharon, MA (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 16/850,060

(22) Filed: Apr. 16, 2020

(65) Prior Publication Data

US 2020/0339919 A1    Oct. 29, 2020

Related U.S. Application Data

(60) Provisional application No. 62/837,776, filed on Apr. 24, 2019.

(51) Int. Cl.
| | |
|---|---|
| *C11D 7/32* | (2006.01) |
| *C11D 11/00* | (2006.01) |
| *C11D 3/30* | (2006.01) |
| *C11D 3/20* | (2006.01) |
| *C11D 3/00* | (2006.01) |
| *C11D 3/43* | (2006.01) |
| *C11D 3/28* | (2006.01) |

(52) U.S. Cl.
CPC ........ *C11D 11/0047* (2013.01); *C11D 3/0026* (2013.01); *C11D 3/0073* (2013.01); *C11D 3/2086* (2013.01); *C11D 3/28* (2013.01); *C11D 3/30* (2013.01); *C11D 3/43* (2013.01)

(58) Field of Classification Search
CPC .................................................. C11D 11/0047
USPC ........................................................ 510/175
See application file for complete search history.

(56) References Cited

U.S. PATENT DOCUMENTS

| | | | |
|---|---|---|---|
| 9,012,387 | B2 | 4/2015 | Atkinson et al. |
| 9,360,761 | B2 | 6/2016 | Choi |
| 9,914,902 | B2 | 3/2018 | Du et al. |
| 10,266,799 | B2* | 4/2019 | Mizutani ............... C11D 3/2086 |
| 10,947,484 | B2* | 3/2021 | Mizutani ................. C11D 3/30 |
| 2005/0130082 | A1 | 6/2005 | Kanda et al. |
| 2005/0245422 | A1 | 11/2005 | Yamada et al. |
| 2006/0063687 | A1 | 3/2006 | Minsek et al. |
| 2006/0154186 | A1 | 7/2006 | Minsek et al. |
| 2009/0082240 | A1 | 3/2009 | Nukui et al. |
| 2010/0152086 | A1 | 6/2010 | Wu et al. |
| 2010/0261632 | A1 | 10/2010 | Korzenski et al. |
| 2012/0042898 | A1 | 2/2012 | Visintin et al. |
| 2012/0129095 | A1 | 5/2012 | Levanon et al. |
| 2013/0109605 | A1 | 5/2013 | Rath et al. |
| 2016/0186106 | A1* | 6/2016 | Du .......................... G03F 7/425 510/176 |
| 2017/0278701 | A1 | 9/2017 | Oie et al. |
| 2017/0335252 | A1* | 11/2017 | Mizutani .................. C11D 3/43 |
| 2019/0233771 | A1 | 8/2019 | Mizutani et al. |
| 2020/0339919 | A1* | 10/2020 | Mizutani .................. C11D 3/43 |

FOREIGN PATENT DOCUMENTS

| | | | | |
|---|---|---|---|---|
| CN | 1618041 | A | 5/2005 | ............... G03F 7/32 |
| CN | 1693439 | | 11/2005 | ............... C11D 3/26 |
| CN | 101137939 | A | 3/2008 | ............... G03F 7/30 |
| CN | 102466986 | A | 5/2012 | ............... G03F 7/32 |
| CN | 102893218 | A | 1/2013 | ............... G03F 7/42 |
| CN | 103189803 | A | 7/2013 | ............... G03G 9/00 |
| EP | 2 482 134 | | 8/2012 | ............... G03F 7/30 |
| JP | 2002-107953 | A | 4/2002 | ............... G03F 7/32 |
| JP | JR 2012-9513 | | 1/2012 | ........... H01L 21/304 |
| WO | WO 2006/056298 | | 6/2006 | ............... C11D 7/50 |
| WO | WO 2008/039730 | | 4/2008 | ............... C11D 7/32 |
| WO | WO 2011/142600 | | 11/2011 | ............... G03F 7/42 |
| WO | WO 2012/009639 | | 1/2012 | ........... H01L 21/302 |
| WO | WO 2016/076031 | | 5/2016 | ........... H01L 21/304 |
| WO | WO 2016/109387 | | 7/2016 | ............... G03F 7/32 |
| WO | WO 2017/205134 | | 11/2017 | ............... B08B 3/00 |

OTHER PUBLICATIONS

European Search Report for European Application No. EP 17 17 2498 dated Aug. 24, 2017.
Extended European Search Report for European Application No. EP 19166565 dated Jul. 24, 2019.
International Search Report and Written Opinion of the International Searching Authority for International Application No. PCT/US17/33041 dated Aug. 17, 2017.
International Search Report and Written Opinion of the International Searching Authority for International Application No. PCT/US2020/028473 dated Jul. 17, 2020.
Office Action for Chinese Application No. CN 201780030713.4 dated Jan. 26, 2021 (with machine English Translation).

(Continued)

*Primary Examiner* — Gregory E Webb

(74) *Attorney, Agent, or Firm* — Fish & Richardson P.C.

(57) ABSTRACT

This disclosure relates to compositions containing 1) at least one water soluble polar aprotic organic solvent; 2) at least one quaternary ammonium hydroxide; 3) at least one carboxylic acid; 4) at least one Group II metal cation; 5) at least one copper corrosion inhibitor selected from the group consisting of 6-substituted-2,4-diamino-1,3,5-triazines; and 6) water, in which the composition is free of a compound comprising at least three hydroxyl groups. The compositions can effectively strip positive or negative-tone resists or resist residues, and be non-corrosive to bumps and underlying metallization materials (such as SnAg, CuNiSn, CuCoCu, CoSn, Ni, Cu, Al, W, Sn, Co, and the like) on a semiconductor substrate.

41 Claims, No Drawings

(56) References Cited

OTHER PUBLICATIONS

Office Action and Search Report for Taiwanese Application No. TW 106116911 dated Oct. 22, 2020 (With English summary).
Communication from the European Patent Office for European Patent Application No. EP 19 166 565.2 dated Sep. 21, 2020.

* cited by examiner

STRIPPING COMPOSITIONS FOR REMOVING PHOTORESISTS FROM SEMICONDUCTOR SUBSTRATES

CROSS-REFERENCE TO RELATED APPLICATION

The present application claims priority to U.S. Provisional Application Ser. No. 62/837,776, filed on Apr. 24, 2019, the contents of which are hereby incorporated by reference in their entirety.

FIELD OF THE DISCLOSURE

The present disclosure relates generally to stripping compositions for removal of photoresists (e.g., positive or negative photoresists) or photoresist residues from semiconductor substrates. Specifically, the present disclosure relates to alkaline compositions useful for removing photoresists or photoresist residues after an etching or plasma ashing process.

BACKGROUND OF THE DISCLOSURE

In the manufacture of integrated circuits, a flip chip process known as Controlled Collapse Chip Connection (C4) process for interconnecting semiconductor devices, such as IC chips and microelectromechanical systems (MEMS) to external circuitry with solder bumps that have been deposited onto the chip pads, has now become quite well established. Thick negative-tone photoresist is commonly applied during flip chip or C4 processes and commercially available resist stripping formulations for thick negative-tone resist are predominantly DMSO (dimethylsulfoxide) or NMP (N-methylpyrrolidone) plus TMAH (tetramethylammonium hydroxide) based formulations. However, those commercially available resist stripping formulations for thick negative-tone resist may exhibit the problems of insufficient resist stripping capability, short bath life, or poor compatibility with metal substrates and bump compositions. In addition, foaming issues produced by the dissolved photoresist or the surfactants in the dissolved photoresist can occur.

SUMMARY OF THE DISCLOSURE

This disclosure describes the development of resist stripping compositions tailored for devices containing bumps and metallization materials (such as SnAg, CuNiSn, CuCoCu, CoSn, Ni, Cu, Al, W, Sn, Co, and the like). The inventors discovered unexpectedly that the ability to effectively strip thick positive or negative-tone resist and be non-corrosive to bumps and underlying metallization materials (such as SnAg, CuNiSn, CuCoCu, CoSn, Ni, Cu, Al, W, Sn, Co, and the like) can be achieved by using the compositions of the present disclosure. Indeed, it has been discovered that the compositions of the disclosure are effective in suppressing Cu and Al etching while maintaining excellent stripping and cleaning performance. In addition, the compositions of this disclosure exhibit broad material compatibility and can effectively control foaming issues during the stripping process.

In some embodiments, this disclosure features a photoresist stripping composition that includes (e.g., comprises, consists of, or consists essentially of):
1) at least one water soluble polar aprotic organic solvent;
2) at least one quaternary ammonium hydroxide;
3) at least one carboxylic acid;
4) at least one Group II metal cation;
5) at least one copper corrosion inhibitor selected from the group consisting of 6-substituted-2,4-diamino-1,3,5-triazines; and
6) water;
wherein the composition is free of a compound comprising at least three hydroxyl groups.

In some embodiments, this disclosure features a photoresist stripping composition that includes (e.g., comprises, consists of, or consists essentially of):
1) at least one water soluble polar aprotic organic solvent;
2) at least one quaternary ammonium hydroxide;
3) at least one copper corrosion inhibitor selected from the group consisting of 6-substituted-2,4-diamino-1,3,5-triazines; and
4) water;
wherein the composition is free of a carboxylic acid, a Group II metal cation, and a compound comprising at least three hydroxyl groups.

In some embodiments, this disclosure concerns a photoresist stripping method that includes contacting a semiconductor substrate containing a photoresist or a photoresist residue with a photoresist stripping composition of this disclosure to remove the photoresist or photoresist residue. In some embodiments, the stripping method further includes forming a semiconductor device (e.g., an integrated circuit device such as a semiconductor chip) from the semiconductor substrate obtained by the method described above.

DETAILED DESCRIPTION OF THE DISCLOSURE

As defined herein, unless otherwise noted, all percentages expressed should be understood to be percentages by weight to the total weight of the stripping composition. Unless otherwise noted, ambient temperature is defined to be between about 16 and about 27 degrees Celsius (° C.).

As defined herein, a "water-soluble" substance (e.g., a water-soluble alcohol, ketone, ester, ether, and the like) refers to a substance having a solubility of at least 0.5% by weight (e.g., at least 1% by weight or at least 5% by weight) in water at 25° C.

As used herein, the term "polar aprotic solvent" refers to a solvent that lacks an acidic proton and has a relatively high dipole moment (e.g., at least 2.7).

As defined herein, a "Group II metal cation" refers to a cation of a metal in Group II of the Periodic Table.

In some embodiments, this disclosure concerns a photoresist stripping composition including (e.g., comprising, consisting of, or consisting essentially of):
1) at least one water soluble polar aprotic organic solvent;
2) at least one quaternary ammonium hydroxide;
3) at least one carboxylic acid;
4) at least one Group II metal cation;
5) at least one copper corrosion inhibitor selected from the group consisting of 6-substituted-2,4-diamino-1,3,5-triazines; and
6) water;
wherein the composition is free of a compound comprising at least three hydroxyl groups (e.g., a sugar alcohol such as glycerol).

In some embodiments, the stripping compositions of this disclosure contain at least one water soluble polar aprotic organic solvent. The water soluble polar aprotic organic solvent can be one water soluble solvent or a mixture of water soluble solvents in any ratio. Examples of such solvents suitable for use in the present disclosure include, but are not limited to, dimethyl sulfoxide, sulfolane, dimethylsulfone, N,N-dimethylformamide, N,N-dimethylacetamide, N-methylpyrrolidone, gamma-butyrolactone, propylene carbonate, 1,3-dimethyl-2-imidazolidinone and mixtures thereof. In some embodiments, the water soluble polar aprotic organic solvent is dimethyl sulfoxide, sulfolane, gamma-butyrolactone, or N-methylpyrrolidone.

In some embodiments, the stripping compositions of this disclosure contain the at least one water soluble polar aprotic organic solvent in an amount of at least about 30% by weight (e.g., at least about 40% by weight, at least about 50% by weight or at least about 60% by weight) and/or at most about 90% by weight (e.g., at most about 85% by weight, at most about 80% by weight or at most about 75% by weight) of the stripping compositions.

Optionally, the stripping compositions of this disclosure contain at least one alcohol solvent, such as a water soluble alcohol solvent. Classes of water soluble alcohol solvents include, but are not limited to, alkane diols (including, but not limited to, alkylene glycols), glycols, alkoxyalcohols (including but not limited to glycol monoethers), saturated aliphatic monohydric alcohols, unsaturated non-aromatic monohydric alcohols, alcohols (e.g., low molecular weight alcohols) containing a ring structure, and mixtures thereof. The stripping compositions can include one alcohol solvent or a mixture of alcohol solvents in any ratio. In some embodiments, the compositions of the disclosure do not contain at least one alcohol solvent.

Examples of water soluble alkane diols include, but are not limited to, 2-methyl-1,3-propanediol, 1,3-propanediol, 2,2-dimethyl-1,3-propanediol, 1,4-butanediol, 1,3-butanediol, 1,2-butanediol, 2,3-butanediol, pinacol, and alkylene glycols.

Examples of water soluble alkylene glycols include, but are not limited to, ethylene glycol, propylene glycol, hexylene glycol, diethylene glycol, dipropylene glycol, triethylene glycol, and tetraethyleneglycol.

Examples of water soluble alkoxyalcohols include, but are not limited to, 3-methoxy-3-methyl-1-butanol, 3-methoxy-1-butanol, 1-methoxy-2-butanol, and water soluble glycol monoethers.

Examples of water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol monobenzyl ether, and diethylene glycol monobenzyl ether.

Examples of water soluble saturated aliphatic monohydric alcohols include, but are not limited to, methanol, ethanol, n-propyl alcohol, isopropyl alcohol, 1-butanol, 2-butanol, isobutyl alcohol, tert-butyl alcohol, 2-pentanol, t-pentyl alcohol, and 1-hexanol.

Examples of water soluble unsaturated non-aromatic monohydric alcohols include, but are not limited to, allyl alcohol, propargyl alcohol, 2-butenyl alcohol, 3-butenyl alcohol, and 4-penten-2-ol.

Examples of water soluble, low molecular weight alcohols containing a ring structure include, but are not limited to, tetrahydrofurfuryl alcohol, furfuryl alcohol, and 1,3-cyclopentanediol.

In some embodiments, the water soluble alcohol solvents are, alkoxyalcohols, tetrahydrofurfuryl alcohol, and water soluble alkanediols. In some embodiments, the water soluble alcohol solvents are 3-methoxy-3-methyl-1-butanol, 3-methoxy-1-butanol, 1-methoxy-2-butanol, water soluble glycol monoethers, water soluble alkylene glycols, and tetrahydrofurfuryl alcohol. In some embodiments, the water soluble alcohol solvents are 3-methoxy-3-methyl-1-butanol, diethylene glycol monomethyl ether, diethylene glycol monoethyl ether, ethylene glycol mono n-butyl ether, propylene glycol, hexylene glycol, and tetrahydrofurfuryl alcohol.

In some embodiments, when the photoresist stripping method described herein employs a heated photoresist stripping composition described herein, the water soluble alcohols can have a boiling point above 110° C. for safety considerations.

In some embodiments, the stripping compositions of this disclosure contain the at least one alcohol solvent in an amount of at least about 5% by weight (e.g., at least about 7% by weight, at least about 10% by weight or at least about 12% by weight) and/or at most about 60% by weight (e.g., at most about 45% by weight, at most about 35% by weight or at most about 25% by weight) of the stripping compositions.

In some embodiments, the stripping compositions of this disclosure contain at least one quaternary ammonium hydroxide. In some embodiments, the preferred quaternary ammonium hydroxide is a compound represented by the general formula $[NR_1R_2R_3R_4]^+OH$, where $R_1$, $R_2$, $R_3$, and $R_4$ are independently a linear, branched or cyclic alkyl group optionally substituted by hydroxy, a substituted or unsubstituted phenyl group, or a substituted or unsubstituted benzyl group(e.g., a benzyl group substituted or unsubstituted on its phenyl group). Substituents on the phenyl group and on the phenyl group of the benzyl group may include halogen, hydroxyl, alkoxy, or alkyl. In some embodiments, the quaternary ammonium hydroxide is a tetralkylammonium hydroxide. In some embodiments, the quaternary ammonium hydroxide is a tetralkanol ammonium hydroxide. In some embodiments, the quaternary ammonium hydroxide is a mixture of two or more quaternary ammonium hydroxides in any ratio.

In some embodiments, the preferred quaternary ammonium hydroxide is a compound of the general formula $[NR_1R_2R_3R_4]^+OH$, where $R_1$, $R_2$, $R_3$, and $R_4$ are independently a $C_1$-$C_4$ alkyl group, a hydroxyethyl group, a phenyl group, or a benzyl group.

Examples of suitable quaternary ammonium hydroxide compounds include, but are not limited to, tetramethylammonium hydroxide (TMAH), tetraethylammonium hydroxide (TEAH), tetrapropylammonium hydroxide, tetrabutylammonium hydroxide (TBAH), ethyltrimethylammonium hydroxide, diethyldimethylammonium hydroxide, methyltripropylammonium hydroxide, butyltrimethylammonium hydroxide, methyltributylammonium hydroxide, pentyltrimethylammonium hydroxide, (2-hydroxyethyl)trimethylammonium hydroxide (choline), (2-hydroxyethyl)triethylammonium hydroxide, (2-hydroxyethyl)triethyl-ammonium hydroxide, (3-hydroxypropyll)triethylammonium hydroxide, tris-2-hydroxyethylammonium hydroxide, tetraethanolammonium hydroxide, phenyltrimethylammonium hydroxide, benzyltrimethylammonium hydroxide and mixtures thereof.

In some embodiments, the stripping compositions of this disclosure contain the at least one quaternary ammonium hydroxide in an amount of at least about 0.1% by weight (e.g., at least about 0.5% by weight, at least about 1% by weight or at least about 1.5% by weight) and/or at most about 15% by weight (e.g., at most about 12% by weight, at most about 10% by weight, at most about 8% by weight, at most about 5% by weight or at most about 3% by weight) of the stripping compositions.

In some embodiments, the stripping compositions of the disclosure can optionally include at least one Group II metal cation. Examples of suitable Group II metal cations include $Ca^{2+}$, $Mg^{2+}$, $Sr^{2+}$, and $Ba^{2+}$. In some embodiments, the stripping compositions described herein can include the Group II metal cation in an amount of at least about 5 ppm (e.g., at least about 7 ppm, at least about 8 ppm, or at least about 10 ppm) and/or at most about 40 ppm (e.g., at most about 35 ppm, at most about 25 ppm, at most about 20 ppm, or at most about 15 ppm). In other embodiments, the stripping compositions of the disclosure can exclude (or can be free of) a Group II metal cation described above while still capable of achieving their objectives (e.g., providing excellent stripping and cleaning performance while suppressing Cu and Al etching).

Without wishing to be bound by theory, it is believed that a stripping composition containing solubilized Group II metal cations (e.g., calcium cation) can significantly reduce the Al etch rate of the stripping composition, thereby allowing the stripping composition to inhibit Al etch during use. Further, without wishing to be bound by theory, it is believed that, as Group II metal compounds are generally not very soluble in the stripping compositions described herein, adding an agent that can solubilize Group II metal cations (e.g., by forming a complex with a Group II metal cation) can significantly increase the amount of the solubilized Group II metal cations in the stripping compositions, thereby improving their Al etch inhibition abilities.

Thus, in some embodiments, the stripping compositions of the disclosure can optionally include one or more compounds that improve the solubility of Group II metal cations in water soluble polar aprotic organic solvents. These compounds include compounds having at least three hydroxyl groups. In some embodiments, the compounds are sugar alcohols. Sugar alcohols contemplated for use in the compositions of the disclosure include, but are not limited to, glycerol, sorbitol, mannitol, erythritol, arabitol, isomalt, lactitol, maltitol, xylitol, threitol, ribitol, galactitol, iditol, and inositol. In some embodiments, the sugar alcohol is glycerol or sorbitol.

In some embodiments, the stripping compositions described herein can include the at least one compound having at least three hydroxyl groups in an amount of at least about 0.1% by weight (e.g., at least about 0.5% by weight, at least about 1% by weight or at least about 1.5% by weight) and/or at most about 10% by weight (e.g., at most about 8% by weight, at most about 5% by weight or at most about 3% by weight) of the stripping compositions. In other embodiments, the stripping compositions of the disclosure can exclude (or can be free of) a compound having at least three hydroxyl groups described above while still capable of achieving their objectives (e.g., providing excellent stripping and cleaning performance while suppressing Cu and Al etching).

In some embodiments, the stripping compositions of the disclosure can optionally include at least one carboxylic acid. Without wishing to be bound by theory, it is believed that carboxylic acids act in concert with compounds having at least three hydroxyl groups can improve the solubility of Group II metal cations in water soluble polar aprotic organic solvents. In some embodiments, examples of the at least one carboxylic acid contemplated for use in the compositions of the disclosure include, but are not limited to, monocarboxylic acids, bicarboxylic acids, tricarboxylic acids, α-hydroxyacids and β-hydroxyacids of monocarboxylic acids, α-hydroxyacids or β-hydroxyacids of bicarboxylic acids, or α-hydroxyacids and β-hydroxyacids of tricarboxylic acids. In some embodiments, the at least one carboxylic acid includes citric acid, maleic acid, fumaric acid, lactic acid, glycolic acid, oxalic acid, tartaric acid, succinic acid, or benzoic acid. In some embodiments, the carboxylic acid is citric acid.

In some embodiments, the stripping compositions described herein can include the at least one carboxylic acid in an amount of at least about 0.1% by weight (e.g., at least about 0.2% by weight, at least about 0.3% by weight or at least about 0.4% by weight) and/or at most about 1.5% by weight (e.g., at most about 1.2% by weight, at most about 0.9% by weight or at most about 0.6% by weight) of the stripping compositions. In other embodiments, the stripping compositions of the disclosure can exclude (or can be free of) a carboxylic acid described above while still capable of achieving their objectives (e.g., providing excellent stripping and cleaning performance while suppressing Cu and Al etching).

The stripping compositions of the present disclosure generally contain water. In some embodiments, the water is de-ionized and ultra-pure, contains no organic contaminants and has a minimum resistivity of about 4 to about 17 mega Ohms. In some embodiments, the resistivity of the water is at least 17 mega Ohms.

In some embodiments, the stripping compositions of this disclosure contain water in an amount of at least about 1% by weight (e.g., at least about 2.5% by weight, at least about 5% by weight, at least about 7% by weight or at least about 10% by weight) and/or at most about 25% by weight (e.g., at most about 20% by weight, at most about 15% by weight or at most about 12.5% by weight) of the stripping compositions.

In some embodiments, the stripping compositions of the present disclosure include at least one copper corrosion inhibitor, which is a 6-substituted-2,4-diamino-1,3,5-triazine. The substituent on the 2,4-diamino-1,3,5-triazine can be a linear or branched substituted or unsubstituted $C_1$-$C_{12}$ alkyl group (e.g., methyl, hexyl, —$CH_2$-aryl, $CH_2OR^{100}$, —$CH_2SR^{100}$, —$CH_2(NR^{100}R^{101})$) a substituted or unsubstituted $C_3$-$C_{12}$ cycloalkyl group (e.g., cyclohexyl, methylcyclohexyl, or hydroxycyclohexyl), a substituted or unsubstituted aryl group (e.g., phenyl, methoxyphenyl, or naphthyl), —$SCH_2R^{100}$, —$N(R^{100}R^{101})$, or imidyl, where each of $R^{100}$ and $R^{101}$, independently, is a linear or branched, substituted or unsubstituted $C_1$-$C_{12}$ alkyl group optionally containing a nitrogen or oxygen atom in the alkyl chain, a substituted or unsubstituted $C_3$-$C_{12}$ cycloalkyl group optionally containing a nitrogen or oxygen atom in the cycloalkyl ring, a substituted or unsubstituted aryl group, or $R^{100}$ and $R^{101}$, together with the atom to which they are attached, form a ring. Substituents on the alkyl and cycloalkyl groups can include, $C_1$-$C_4$ alkyl, $C_1$-$C_4$ alkoxy, hydroxyl, and substituted or unsubstituted aryl. In some embodiments, substituents on the aryl groups are electron donating (e.g., alkoxy) rather than electron withdrawing (e.g., halogen).

Examples of suitable 6-substituted-2,4-diamino-1,3,5-triazines include 6-methyl-2,4-diamino-1,3,5-triazine; 6-phenyl-2,4-diamino-1,3,5-triazine (benzoguanamine), 6-phenyl-2,4-diamino-1,3,5-dimethyltriazine; 1,3,5-triazine-2,4-diamine, 6-[2-(2-furanyl)ethyl]-; 1,3,5-triazine-2,4-diamine, 6-[hexahydro-1-methylpyrrolo[3,4-c]pyrrol-2(1H)-yl) methyl]-; 1,3,5-triazine-2,4-diamine, 6-[[(3-aminobutyl) thio]methyl]-; 1,3,5-triazine-2,4-diamine, 6-(4,4-difluorocyclohexyl)-; 1,3,5-triazine-2,4-diamine, 6-[(3-chlorophenyl) methyl]-; 1,3,5-triazine-2,4-diamine, 6-[(phenylthio) methyl]-; 1,3,5-triazine-2,4-diamine, 6-[(tetrahydro-2H-pyran-2-yl)methyl]-; 2-(4,6-diamino-1,3,5-triazin-2-yl)-4-fluoro-phenol; 1,3,5-triazine-2,4-diamine, 6-(1-ethylcyclopentyl)-; 1,3,5-triazine-2,4-diamine, 6-[[4-(diphenylmethyl)-1-piperazinyl]methyl]-; 9-acridinecarboxylic acid, 1,2,3,4-tetrahydro-4-[(4-methoxyphenyl)methylene]-, (4,6-diamino-1,3,5-triazin-2-yl)methyl ester; 1H-Benz[de]isoquinoline-1,3(2H)-dione, 2-[[(4,6-diamino-1,3,5-triazin-2-yl)amino]methyl]-; 9-acridinecarboxylic acid, 2-(1,1-dimethylpropyl)-1,2,3,4-tetrahydro-,(4,6-diamino-1,3,5-triazin-2-yl)methyl ester; 1,3,5-triazine-2,4,6-triamine, N2-[2-[(7-chloro-4-quinolinyl) amino]ethyl]-; 1,3,5-triazine-2,4-diamine, 6-[[4-(1-methylethyl)phenoxy]methyl]-; 1,3,5-triazine-2,4-diamine, 6-[[3-(trifluoromethyl)phenoxy]methyl]-; 1,3,5-triazine-2,4-diamine, 6-[[(tetrahydro-2H-pyran-2-yl)methyl]thio]-; N-cyclohexyl-2-[(4,6-diamino-1,3,5-triazin-2-yl)thio]-propanamide; 3-chloro-4-[(4,6-diamino-1,3,5-triazin-2-yl) methoxy]-5-methoxy-benzonitrile; benzeneacetic acid, 3-methoxy-, (4,6-diamino-1,3,5-triazin-2-yl)methyl ester; 1,3,5-triazine-2,4-diamine, 6-[3-(1-pyrrolidinyl)phenyl]-; 1,3,5-triazine-2-octanenitrile, 4,6-diamino-; s-triazine-2-butyronitrile, 4,6-diamino-; 1,3,5-triazine-2-propanoic acid, 4,6-diamino-; 1,3,5-triazine-2-methanethiol, 4,6-diamino-; benzamide, N-(4,6-diamino-1,3,5-triazin-2-yl)-4-hydroxy-; and 1,3,5-triazine-2,4-diamine, 6-[(methylthio)methyl]-.

In some embodiments, the stripping compositions of this disclosure contain at least one copper corrosion inhibitor in an amount of at least about 0.01% by weight (e.g., at least about 0.05% by weight, at least about 0.1% by weight or at least about 0.5% by weight) and/or at most about 10% by weight (e.g., at most about 7% by weight, at most about 5% by weight or at most about 2% by weight) of the stripping compositions.

In some embodiments, the stripping compositions of the present disclosure optionally include a defoaming surfactant. Examples of suitable defoaming surfactants include polysiloxanes (e.g., polydimethylsiloxane), polyethylene glycol methyl ether polymers, ethylene oxide/propylene oxide copolymers, tetramethyldecynediol, polyethylene glycol alkynyl ether polymers (e.g., those prepared by reacting polyethylene glycol with an acetylenic diol), and glycidyl ether capped acetylenic diol ethoxylates (such as those described in U.S. Pat. No. 6,717,019, which is herein incorporated by reference). Examples of commercial defoaming surfactants include Surfynol 440, Surfynol 104, Surfynol MD-20, Troysol S366, Coastal 1017F, Aldo LF, Dow DB-100, and Dow DSP. In some embodiments, defoaming surfactants are Surfynol MD-20, Surfynol 104, and Troysol S366. In some embodiments, the compositions of the disclosure do not contain a defoaming surfactant.

In some embodiments, the stripping compositions of this disclosure contain the at least one defoaming surfactant in an amount of at least about 0.01% by weight (e.g., at least about 0.03% by weight, at least about 0.05% by weight or at least about 0.1% by weight) and/or at most about 3% by weight (e.g., at most about 2% by weight, at most about 1% by weight or at most about 0.5% by weight) of the stripping compositions.

In addition, in some embodiments, the stripping compositions of the present disclosure can contain additional additives such as, pH adjusting agents (such as organic acids, inorganic acids, and organic bases), corrosion inhibitors, chelating agents, surfactants, organic solvents (e.g., glycol diethers), and biocides, as optional components.

In some embodiments, the stripping compositions of the present disclosure may specifically exclude one or more of the following components (e.g., such as certain components described above), in any combination, if more than one. Such excluded components are selected from the group consisting of polymers, oxygen scavengers, amidoximes, oxidizing agents (e.g., peroxides, oxoammonium compounds, inorganic oxidizing agents, and peracids), abrasives (e.g., silica or alumina), fluoride containing compounds, amines, alkali metal and alkaline earth bases (such as NaOH, KOH, magnesium hydroxide, calcium hydroxide and LiOH), metal halide compounds, phosphinic acids, tetrahydrofurfuryl alcohol, glycols, furanyl alcohol, glycerine, saccharides, aryl ethers, N-hydroxy formamide, alkanolamines, N-alkylalkanolamines, sulfonated polymers, metal sulfonates, hydroxylamine, 2-aminobenzothiazole, thiobenzotriazole, sulfonated polyesters, urea compounds, silicate bases, silanes, silicon compounds, surfactants other than a defoaming surfactant, pyrolidone, steric hindered amide solvents such as 1,3-dimethyl-2-piperidone and 1,5-dimethyl-2-piperidone, sulfur compounds other than DMSO or dimethylsulfone or triazole compounds containing sulfur-containing substituents, tetrazolium salts, boric acid and salts or derivatives of boric acid, benzimidazoles, non-triazole containing phenolic compounds, chelating agents, buffering agents, azoles (e.g., diazoles, triazoles, or tetrazoles), salts (e.g., sulfate salts, sulfonate salts, halide salts (e.g., chloride salts), nitrate salts, acetate salts, phosphate salts, and metal salts such as metal halides, potassium salts (e.g., potassium nitrate), sodium salts, and silver salts), and corrosion inhibitors other than the Cu or Al corrosion inhibitors described in this disclosure.

In some embodiments, the stripping compositions of this disclosure contain, consist of, or consist essentially of:

(1) at least about 30% by weight (e.g., at least about 40% by weight, at least about 50% by weight or at least about 60% by weight) and/or at most about 90% by weight (e.g., at most about 85% by weight, at most about 80% by weight or at most about 75% by weight) of at least one water soluble polar aprotic solvent (e.g., DMSO);

(2) optionally, at least about 5% by weight (e.g., at least about 7% by weight, at least about 10% by weight or at least about 12% by weight) and/or at most about 60% by weight (e.g., at most about 45% by weight, at most about 35% by weight or at most about 25% by weight) of at least one alcohol solvent;

(3) at least about 0.1% by weight (e.g., at least about 0.5% by weight, at least about 1% by weight or at least about 1.5% by weight) and/or at most about 15% by weight (e.g., at most about 12% by weight, at most about 10% by weight, at most about 8% by weight, at most about 5% by weight or at most about 3% by weight) of at least one quaternary ammonium hydroxide (e.g., TMAH);

(4) at least about 1% by weight (e.g., at least about 2.5% by weight, at least about 5% by weight, at least about 7% by weight or at least about 10% by weight) and/or at most about 25% by weight (e.g., at most about 20% by weight, at most about 15% by weight or at most about 12.5% by weight) of water;

(5) at least about 0.01% by weight (e.g., at least about 0.05% by weight, at least about 0.1% by weight or at least about 0.5% by weight) and/or at most about 10% by weight (e.g., at most about 7% by weight, at most about 5% by weight or at most about 2% by weight) of at least one copper corrosion inhibitor selected from 6-substituted 2,4-diamino-1,3,5-triazines (e.g., 6-phenyl-2,4-diamino-1,3,5-triazine);

(6) optionally, at least about 0.01% by weight (e.g., at least about 0.03% by weight, at least about 0.05% by weight or at least about 0.1% by weight) and/or at most about 3% by weight (e.g., at most about 2% by weight, at most about 1% by weight or at most about 0.5% by weight) of at least one defoaming surfactant (e.g., a polyethylene glycol alkynyl ether polymer such as Surfynol MD-20);

(7) optionally, at least about 5 ppm (e.g., at least about 7 ppm, at least about 8 ppm, or at least about 10 ppm) and/or at most about 40 ppm (e.g., at most about 35 ppm, at most about 25 ppm, at most about 20 ppm, or at most about 15 ppm) of at least one Group II metal cation (e.g., $Ca^{2+}$);

(8) optionally, at least about 0.1% by weight (e.g., at least about 0.5% by weight, at least about 1% by weight or at least about 1.5% by weight) and/or at most about 10% by weight (e.g., at most about 8% by weight, at most about 5% by weight or at most about 3% by weight) of at least one compound having at least three hydroxyl groups (e.g., glycerol); and (9) optionally, at least about 0.1% by weight (e.g., at least about 0.2% by weight, at least about 0.3% by weight or at least about 0.4% by weight) and/or at most about 1.5% by weight (e.g., at most about 1.2% by weight, at most about 0.9% by weight or at most about 0.6% by weight) of at least one carboxylic acid (e.g., citric acid).

The stripping compositions of the present disclosure generally are alkaline in nature. In some embodiments, the stripping compositions of the present disclosure has a pH of at least about 13 (e.g., at least about 13.5 or at least about 14). Without wishing to be bound by theory, it is believed that the alkaline nature of the stripping compositions can facilitate removal of a photoresist on a semiconductor substrate.

One embodiment of the present disclosure is a method of stripping or removing photoresist from a semiconductor substrate. The method includes contacting a semiconductor substrate containing a photoresist or a photoresist residue with a stripping composition described herein for a suitable period of time and at a temperature sufficient to remove the photoresist or photoresist residue from the substrate surface. The method can further include rinsing the semiconductor substrate with a rinse solvent after the contacting step and/or drying the semiconductor substrate after the rinsing step. In some embodiments, the method does not substantially remove Cu or Al in the semiconductor substrate.

In some embodiments, the photoresist stripping methods include the steps of:

(A) providing a semiconductor substrate having a photoresist coating or a photoresist residue;

(B) contacting said semiconductor substrate with a stripping composition described herein to remove the photoresist coating or the photoresist residue;

(C) rinsing said semiconductor substrate with a suitable rinse solvent; and (D) optionally, drying said semiconductor substrate by any suitable means that removes the rinse solvent and does not compromise the integrity of said semiconductor substrate. In some embodiments, the stripping method further includes forming a semiconductor device (e.g., an integrated circuit device such as a semiconductor chip) from the semiconductor substrate obtained by the method described above.

The semiconductor substrates to be stripped in this method have at least one photoresist (e.g., a positive or negative photoresist) that needs to be removed. Semiconductor substrates typically are constructed of silicon, silicon germanium, Group III-V compounds like GaAs, or any combination thereof. The semiconductor substrates may additionally contain exposed integrated circuit structures such as interconnect features like metal lines and dielectric materials. Metals and metal alloys used for interconnect features include, but are not limited to, aluminum, aluminum alloyed with copper, copper, titanium, tantalum, cobalt, nickel, silicon, polysilicon titanium nitride, tantalum nitride, tin, tungsten, SnAg, SnAg/Ni, CuNiSn, CuCoCu, and CoSn. Said semiconductor substrate may also contain layers of interlayer dielectrics, silicon oxide, silicon nitride, silicon carbide, titanium oxide, and carbon doped silicon oxides.

The semiconductor substrate can be contacted with a stripping composition by any suitable method, such as placing the stripping composition into a tank and immersing and/or submerging the semiconductor substrate into the stripping zo composition, spraying the stripping composition onto the semiconductor substrate, streaming the stripping composition onto the semiconductor substrate, or any combinations thereof. In some embodiments, the semiconductor substrate is immersed into the stripping composition.

The stripping compositions of the present disclosure can be effectively used up to a temperature of about 90° C. (e.g., from about 25° C. to about 80° C., from about 30° C. to about 60° C., or from about 40° C. to about 60° C.). For safety reasons, the maximum temperature is generally kept significantly below the flash points of the solvents being employed.

Similarly, stripping times can vary over a wide range depending on the particular stripping method, temperature and stripping composition employed. When stripping in an immersion batch type process, a suitable time range is, for example, up to about 60 minutes. In some embodiments, a suitable time range for a batch type process is from about 1 minute to about 60 minutes (e.g., from about 3 minutes to about 20 minutes, or from about 4 minutes to about 15 minutes).

Stripping times for a single wafer process can range from about 10 seconds to about 5 minutes (e.g., from about 15 seconds to about 4 minutes, from about 15 seconds to about 3 minutes, or from about 20 seconds to about 2 minutes). In some embodiments, one or more applications of a stripping composition can take place. The volume of a stripping composition employed in single wafer process is typically sufficient to fully cover the substrate, which will depend on the substrate size and the surface tension of the stripping composition.

To further promote the stripping ability of the stripping compositions of the present disclosure, mechanical agitation means can be employed. Examples of suitable agitation means include circulation of a stripping composition over the substrate, streaming or spraying a stripping composition over the substrate, and ultrasonic or megasonic agitation during the stripping process. The orientation of the semiconductor substrate relative to the ground can be at any angle. In some embodiments, horizontal or vertical orientations are suitable.

The stripping compositions of the present disclosure can be used in stripping tools known to those skilled in the art. A significant advantage of the stripping compositions of the present disclosure is that they include relatively non-toxic, non-corrosive, and non-reactive components in whole and in part, whereby the compositions are stable in a wide range of temperatures and process times. The stripping compositions of the present disclosure are generally chemically compatible with practically all materials used to construct existing and proposed semiconductor wafer stripping process tools for batch and single wafer stripping.

Subsequent to the stripping, the semiconductor substrate is rinsed with a suitable rinse solvent for about 5 seconds up to about 5 minutes with or without agitation means. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate and propylene glycol monomethyl ether acetate. The solvent can be applied using means similar to that used in applying a stripping composition described herein. The stripping composition may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art can be employed. Examples of suitable drying means include spin drying, flowing a dry gas across the semiconductor substrate, heating the semiconductor substrate with a heating means such as a hotplate or infrared lamp, Marangoni drying, rotagoni drying, IPA drying and any combinations thereof. Drying times can depend on the specific method employed but are typically on the order of 30 seconds up to several minutes.

In some embodiments, the semiconductor substrate can subsequently be processed to form one or more circuits on the substrate or can be processed to form into a semiconductor chip by, for example, assembling (e.g., dicing and bonding) and packaging (e.g., chip sealing).

The present disclosure is illustrated in more detail with reference to the following examples, which are for illustrative purposes and should not be construed as limiting the scope of the present disclosure.

EXAMPLES

Formulation Examples 1 and 2 (FE-1 and FE-2)

Formulation Examples 1 and 2 (FE-1 and FE-2) were prepared by mixing the components in the order given in Table 1. In FE-2, the last three components were separately mixed before adding to rest of the components.

TABLE 1

| Component | FE-1 (wt %) | FE-2 (wt %) |
| --- | --- | --- |
| Dimethyl sulfoxide (DMSO) | 84.45 | 84.25 |
| Benzoguanamine | 0.5 | 0.7 |
| Surfynol 440 | 0.05 | 0 |
| Surfynol MD-20 | 0 | 0.2 |
| 25% Aqueous TMAH | 10 | 12 |
| DI Water | 5 | 2 |
| Citric acid monohydrate | 0 | 0.338 |
| Calcium citrate tetrahydrate | 0 | 0.012 |
| DI Water | 0 | 0.5 |
| Total | 100 | 100 |

Silicon or copper wafers which have multi-layer $Si/SiO_2/Ta/Cu$ structures were used as substrates for Polyimide (PI), Polybenzoxazole (PBO) or Novolac-PAC based photoresists films. These films were generated on wafers either by spin-coating or dry film lamination methods. The thicknesses of the films were in the range of 8 to 110 μm. Micro-patterns were generated by exposing to actinic radiation using masks or reticles and developed using aqueous base or organic solvents. The developed films were further exposed to radiation and/or cured at higher temperatures except Novolac based films. In the case of Novolac resists, the contact holes and/or trenches were filled with various metals such as Cu, Ni, Pd, Sn, etc. by electroplating before stripping.

The wafers were cut into 1×2 inch pieces and placed vertically in a 600 ml beaker containing 300 ml of the above mentioned stripper solutions. The contents of the beaker were stirred using a magnetic bar, heated and maintained at a constant temperature using a PID controller. After a desired time, the wafer pieces were removed and immediately rinsed with water and blown dry with nitrogen. The extent of stripping and cleanliness were determined by measuring the thickness of the remaining film using Dektak profilometer and inspected by scanning electron microscopy. The results are summarized in Table 2 below.

TABLE 2

| Sample | Resist type | Cure Temp., °C. | Stripper | Temp., °C. | Time, min | Initial Thickness, μm | Final Thickness, μm |
| --- | --- | --- | --- | --- | --- | --- | --- |
| 1 | Polyimide-1 Negative tone | 170 | FE-1 | 75 | 30 | 11.1 | 0 |
| 2 | Polyimide-1 Negative tone | 170 | FE-2 | 75 | 30 | 11.1 | 0 |
| 3 | Polyimide-2 Negative tone | 230 | FE-1 | 75 | 180 | 15.8 | 0 |
| 4 | Polyimide-2 Negative tone | 230 | FE-1 | 85 | 90 | 15.8 | 0 |
| 5 | Polyimide-3 Negative tone | 350 | FE-1 | 75 | 90 | 8.4 | 7.2 |
| 6 | Polyimide-3 Negative tone | 350 | FE-1 | 85 | 180 | 8.4 | 0.8 |
| 7 | PBO Positive tone | 350 | FE-1 | 75 | 90 | 10.7 | 0 |

TABLE 2-continued

| Sample | Resist type | Cure Temp., ° C. | Stripper | Temp., ° C. | Time, min | Initial Thickness, μm | Final Thickness, μm |
|---|---|---|---|---|---|---|---|
| 8 | PBO Positive tone | 350 | FE-1 | 85 | 45 | 10.7 | 0 |
| 9 | Novolac-1 Positive tone | N/A | FE-1 | 60 | 10 | 17.0 | 0 |
| 10 | Novolac-1 Positive tone | N/A | FE-2 | 60 | 10 | 17.0 | 0 |
| 11 | Novolac-2 Positive tone | N/A | FE-1 | 60 | 10 | 110.0 | 0 |

N/A refers to "not applicable".

As shown in Table 2, both FE-1 and FE-2 were able to completely remove the photoresist films tested (except for the photoresist films tested in Samples 5 and 6).

While the disclosure has been described in detail with reference to certain embodiments thereof, it is understood that modifications and variations are within the spirit and scope of that which is described and claimed.

What is claimed is:

1. A composition, comprising:
   1) at least one water soluble polar aprotic organic solvent;
   2) at least one quaternary ammonium hydroxide;
   3) at least one carboxylic acid;
   4) at least one Group II metal cation;
   5) at least one copper corrosion inhibitor selected from the group consisting of 6-substituted-2,4-diamino-1,3,5-triazines; and
   6) water;
   wherein the composition is free of an alcohol solvent and a compound comprising at least three hydroxyl groups.

2. The composition of claim 1, wherein the at least one quaternary ammonium hydroxide comprises a compound of the formula $[NR_1R_2R_3R_4]^+OH$, in which each of $R_1$, $R_2$, $R_3$, and $R_4$, independently, is a linear, branched, or cyclic alkyl group optionally substituted by hydroxy, a substituted or unsubstituted phenyl group, or a substituted or unsubstituted benzyl group.

3. The composition of claim 2, wherein each of $R_1$, $R_2$, $R_3$, and $R_4$, independently, is a $C_1$-$C_4$ alkyl group, a hydroxyethyl group, a phenyl group, or a benzyl group.

4. The composition of claim 1, wherein the composition comprises the at least one quaternary ammonium hydroxide in an amount of from about 0.1 wt % to about 15 wt %.

5. The composition of claim 1, wherein the at least one carboxylic acid is selected from the group consisting of monocarboxylic acids, bicarboxylic acids, tricarboxylic acids, α-hydroxyacids and β-hydroxyacids of monocarboxylic acids, α-hydroxyacids and β-hydroxyacids of bicarboxylic acids, and α-hydroxyacids and β-hydroxyacids of tricarboxylic acids.

6. The composition of claim 5, wherein the at least one carboxylic acid comprises citric acid, maleic acid, fumaric acid, lactic acid, glycolic acid, oxalic acid, tartaric acid, succinic acid, or benzoic acid.

7. The composition of claim 6, wherein the at least one carboxylic acid comprises citric acid.

8. The composition of claim 1, wherein the composition comprises the at least one carboxylic acid in an amount of from about 0.1 wt % to about 1.5 wt %.

9. The composition of claims 1, wherein the at least one Group II metal cation comprises $Mg^{2+}$, $Ca^{2+}$, $Sr^{2+}$, or $Ba^{2+}$.

10. The composition of claim 9, wherein the at least one Group II metal cation comprises $Ca^{2+}$.

11. The composition of claim 1, wherein the composition comprises the at least one Group II metal cation in an amount of from about 5 ppm to about 40 ppm.

12. The composition of claim 1, wherein the at least one copper corrosion inhibitor comprises a 6-substituted-2,4-diamino-1,3,5-triazine, the substituent at the 6-position being a linear or branched, substituted or unsubstituted $C_1$-$C_{12}$ alkyl group, a substituted or unsubstituted $C_3$-$C_{12}$ cycloalkyl group, a substituted or unsubstituted aryl group, $—SCH_2R^{100}$, $—N(R^{100}R^{101})$, or imidyl, in which each of $R^{100}$ and $R^{101}$, independently, is a linear or branched, substituted or unsubstituted $C_1$-$C_{12}$ alkyl group optionally containing a nitrogen or oxygen atom in the alkyl chain, a substituted or unsubstituted $C_3$-$C_{12}$ cycloalkyl group optionally containing a nitrogen or oxygen atom in the cycloalkyl ring, a substituted or unsubstituted aryl group, or $R^{100}$ and $R^{101}$, together with the atom to which they are attached, form a ring.

13. The composition of claim 12, wherein the at least one copper corrosion inhibitor comprises 6-phenyl-2,4-diamino-1,3,5-triazine or 6-methyl-2,4-diamino-1,3,5-triazine.

14. The composition of claim 1, wherein the composition comprises the at least one copper corrosion inhibitor in an amount of from about 0.1 wt % to about 10 wt %.

15. The composition of claim 1, wherein the at least one water soluble polar aprotic organic solvent comprises dimethyl sulfoxide, sulfolane, dimethylsulfone, N,N-dimethylformamide, N,N-dimethylacetamide, N-methylpyrrolidone, gamma-butyrolactone, propylene carbonate, 1,3-dimethyl-2-imidazolidinone, or a mixture thereof.

16. The composition of claim 1, wherein the composition comprises the at least one water soluble polar aprotic organic solvent in an amount of from about 30 wt % to about 90 wt %.

17. The composition of claim 1, wherein the composition comprises the water in an amount of from about 1 wt % to about 25 wt %.

18. The composition of claim 1, further comprising at least one defoaming surfactant.

19. The composition of claim 18, wherein the composition comprises the at least one defoaming surfactant in an amount of from about 0.01 wt % to about 3 wt %.

20. The composition of claim 1, wherein the composition has a pH of at least about 13.

21. The composition of claim 1, wherein the composition comprises dimethyl sulfoxide, tetramethylammonium hydroxide, citric acid, calcium citrate, 6-phenyl-2,4-diamino-1,3,5-triazine, a defoaming agent, and water.

22. The composition of claim 21, wherein the composition comprises dimethyl sulfoxide in an amount of from about 30 wt % to about 90 wt % of the composition;

tetramethylammonium hydroxide in an amount of from about 0.1 wt % to about 15 wt % of the composition;

citric acid in an amount of from about 0.1 wt % to about 1.5 wt % of the composition;

calcium citrate in an amount of from about 5 ppm to about 40 ppm of the composition;

6-phenyl-2,4-diamino-1,3,5-triazine in an amount of from about 0.1 wt % to about 10 wt % of the composition;

a defoaming agent in an amount of from about 0.01 wt % to about 3 wt % of the composition; and water in an amount of from about 1 wt % to about 25 wt % of the composition.

23. A composition, comprising:
1) at least one water soluble polar aprotic organic solvent;
2) at least one quaternary ammonium hydroxide;
3) at least one copper corrosion inhibitor selected from the group consisting of 6-substituted-2,4-diamino-1,3,5-triazines; and
4) water;
wherein the composition is free of an alcohol solvent, a carboxylic acid, a Group II metal cation, and a compound comprising at least three hydroxyl groups.

24. The composition of claim 23, further comprising at least one defoaming surfactant.

25. The composition of claim 24, wherein the composition dimethyl sulfoxide, tetramethylammonium hydroxide, 6-phenyl-2,4-diamino-1,3,5-triazine, a defoaming agent, and water.

26. The composition of claim 25, wherein the composition comprises
dimethyl sulfoxide in an amount of from about 30 wt % to about 90 wt % of the composition;
tetramethylammonium hydroxide in an amount of from about 0.1 wt % to about 15 wt % of the composition;
6-phenyl-2,4-diamino-1,3,5-triazine in an amount of from about 0.1 wt % to about 10 wt % of the composition;
a defoaming agent in an amount of from about 0.01 wt % to about 3 wt % of the composition; and
water in an amount of from about 1 wt % to about 25 wt % of the composition.

27. A method, comprising:
contacting a semiconductor substrate containing a photoresist or a photoresist residue with the composition of claim 1 to remove the photoresist or photoresist residue.

28. The method of claim 27, further comprising rinsing the semiconductor substrate with a rinse solvent after the contacting step.

29. The method of claim 28, further comprising drying the semiconductor substrate after the rinsing step.

30. The method of claim 27, wherein the method does not substantially remove Cu or Al in the semiconductor substrate.

31. The composition of claim 23, wherein the at least one quaternary ammonium hydroxide comprises a compound of the formula $[NR_1R_2R_3R_4]^+OH$, in which each of $R_1$, $R_2$, $R_3$, and $R_4$, independently, is a linear, branched, or cyclic alkyl group optionally substituted by hydroxy, a substituted or unsubstituted phenyl group, or a substituted or unsubstituted benzyl group.

32. The composition of claim 31, wherein each of $R_1$, $R_2$, $R_3$, and $R_4$, independently, is a $C_1$-$C_4$ alkyl group, a hydroxyethyl group, a phenyl group, or a benzyl group.

33. The composition of claim 23, wherein the composition comprises the at least one quaternary ammonium hydroxide in an amount of from about 0.1 wt % to about 15 wt %.

34. The composition of claim 23, wherein the at least one copper corrosion inhibitor comprises a 6-substituted-2,4-diamino-1,3,5-triazine, the substituent at the 6-position being a linear or branched, substituted or unsubstituted $C_1$-$C_{12}$ alkyl group, a substituted or unsubstituted $C_3$-$C_{12}$ cycloalkyl group, a substituted or unsubstituted aryl group, —$SCH_2R^{100}$, —$N(R^{100}R^{101})$, or imidyl, in which each of $R^{100}$ and $R^{101}$, independently, is a linear or branched, substituted or unsubstituted $C_1$-$C_{12}$ alkyl group optionally containing a nitrogen or oxygen atom in the alkyl chain, a substituted or unsubstituted $C_3$-$C_{12}$ cycloalkyl group optionally containing a nitrogen or oxygen atom in the cycloalkyl ring, a substituted or unsubstituted aryl group, or $R^{100}$ and $R^{101}$, together with the atom to which they are attached, form a ring.

35. The composition of claim 34, wherein the at least one copper corrosion inhibitor comprises 6-phenyl-2,4-diamino-1,3,5-triazine or 6-methyl-2,4-diamino-1,3,5-triazine.

36. The composition of claim 23, wherein the composition comprises the at least one copper corrosion inhibitor in an amount of from about 0.1 wt % to about 10 wt %.

37. The composition of claim 23, wherein the at least one water soluble polar aprotic organic solvent comprises dimethyl sulfoxide, sulfolane, dimethylsulfone, N,N-dimethylformamide, N,N-dimethylacetamide, N-methylpyrrolidone, gamma-butyrolactone, propylene carbonate, 1,3-dimethyl-2-imidazolidinone, or a mixture thereof.

38. The composition of claim 23, wherein the composition comprises the at least one water soluble polar aprotic organic solvent in an amount of from about 30 wt % to about 90 wt %.

39. The composition of claim 23, wherein the composition comprises the water in an amount of from about 1 wt % to about 25 wt %.

40. The composition of claim 24, wherein the composition comprises the at least one defoaming surfactant in an amount of from about 0.01 wt % to about 3 wt %.

41. The composition of claim 23, wherein the composition has a pH of at least about 13.

* * * * *

UNITED STATES PATENT AND TRADEMARK OFFICE
CERTIFICATE OF CORRECTION

PATENT NO.         : 11,208,616 B2
APPLICATION NO.    : 16/850060
DATED              : December 28, 2021
INVENTOR(S)        : Mizutani et al.

It is certified that error appears in the above-identified patent and that said Letters Patent is hereby corrected as shown below:

On the Title Page

Item ((*) (Notice)), Line 4, below "0 days." insert -- This patent is subject to a terminal disclaimer. --

Column 2 (Date of Patent), Line 1, delete "Dec. 28, 2021" and insert -- *Dec. 28, 2021 --

Column 2 (Foreign Patent Documents), Line 9, delete "JR" and insert -- JP --

In the Specification

Column 4
Lines 65-66, delete "(2-hydroxyethyl)triethyl-ammonium hydroxide,"

Column 8
Line 30, delete "pyrolidone" and insert -- pyrrolidone --

Column 10
Line 17 (Approx.), after "polysilicon" insert -- , --

Signed and Sealed this
Twenty-fourth Day of May, 2022

Katherine Kelly Vidal
*Director of the United States Patent and Trademark Office*